United States Patent
Lee et al.

(10) Patent No.: US 12,188,890 B2
(45) Date of Patent: Jan. 7, 2025

(54) GAS DETECTION COMPLEX AND METHOD FOR PRODUCING SAME, GAS SENSOR COMPRISING GAS DETECTION COMPLEX AND METHOD FOR MANUFACTURING SAME

(71) Applicant: KOREA UNIVERSITY RESEARCH AND BUSINESS FOUNDATION, Seoul (KR)

(72) Inventors: Jongheun Lee, Seoul (KR); Changhoon Kwak, Yongin-si (KR); Seongyong Jeong, Iksan-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 18/313,581

(22) Filed: May 8, 2023

(65) Prior Publication Data

US 2023/0273139 A1    Aug. 31, 2023

Related U.S. Application Data

(62) Division of application No. 17/052,902, filed as application No. PCT/KR2018/015804 on Dec. 13, 2018, now abandoned.

(30) Foreign Application Priority Data

May 30, 2018   (KR) .................. 10-2018-0062142

(51) Int. Cl.
- *G01N 27/12*   (2006.01)
- *C23C 14/14*   (2006.01)
- *C23C 14/30*   (2006.01)

(52) U.S. Cl.
CPC .......... *G01N 27/125* (2013.01); *C23C 14/14* (2013.01); *C23C 14/30* (2013.01)

(58) Field of Classification Search
CPC .................................................. G01N 27/125
See application file for complete search history.

(56) References Cited

U.S. PATENT DOCUMENTS

2009/0291024 A1   11/2009   Maedler et al.

FOREIGN PATENT DOCUMENTS

| JP | 2008-215887 A | 9/2008 |
| JP | 2012-522242 A | 9/2012 |
| JP | 2016-102758 A | 6/2016 |
| KR | 10-2003-0007914 A | 1/2003 |
| KR | 10-2015-0020334 A | 2/2015 |
| KR | 101616173 B1 * | 7/2015 |

(Continued)

OTHER PUBLICATIONS

Gulyaev et al, Resistive Gas Sensors With Increased Sensitivity To Alcohols Based On Nanocrystalline Films Of Tin Oxide With Terbium And Antimony Additives, 2017, Measurement Techniques, 60, 7, 696-700 (Year: 2017).*

(Continued)

*Primary Examiner* — Matthew D Krcha
*Assistant Examiner* — Austin Q Le
(74) *Attorney, Agent, or Firm* — NSIP Law

(57) ABSTRACT

The inventive concept relates to a complex for detecting gas responsive to gas to be tested. The complex for the detecting the gas contains a nanostructure made of an oxide semiconductor, and a Terbium (Tb) additive supported on the nanostructure.

9 Claims, 14 Drawing Sheets

(56) References Cited

FOREIGN PATENT DOCUMENTS

| KR | 10-1594734 B1 | 2/2016 | | |
|---|---|---|---|---|
| KR | 10-1776116 B1 | 9/2017 | | |
| KR | 10-1813226 B1 | 1/2018 | | |
| KR | 10-2018-0015369 A | 2/2018 | | |
| KR | 10-1837287 B1 | 3/2018 | | |
| WO | WO-2017026785 A1 * | 2/2017 | ............ | C01F 17/235 |

OTHER PUBLICATIONS

Stambolova et al, Lanthanum doped SnO2 and ZnO thin films sensitive to ethanol and humidity, 2000, Materials Chemistry and Physics, 63, 2, 104-108 (Year: 2000).*

Hastir, Anita, Nipin Kohli, and Ravi Chand Singh. "Comparative study on gas sensing properties of rare earth (Tb, Dy and Er) doped ZnO sensor." *Journal of Physics and Chemistry of Solids* 105 (2017): 23-34.

Kwak, Chang-Hoon, et al., "Humidity-Independent Oxide Semiconductor Chemiresistors Using Terbium-Doped SnO2 Yolk-Shell Spheres for Real-Time Breath Analysis," *ACS applied materials & interfaces*, vol. 10, Issue 22, 2018 (pp. 18886-18894).

International Search Report issued on Mar. 15, 2019 in counterpart International Patent Application No. PCT/KR2018/015804 (2 pages in English and 2 pages in Korean).

* cited by examiner

GAS DETECTION COMPLEX AND METHOD FOR PRODUCING SAME, GAS SENSOR COMPRISING GAS DETECTION COMPLEX AND METHOD FOR MANUFACTURING SAME

CROSS-REFERENCE TO RELATED APPLICATION

This application is divisional of U.S. patent application Ser. No. 17/052,902 filed on Nov. 4, 2020, which is a U.S. National Stage Application of International Application No. PCT/KR2018/015804, filed on Dec. 13, 2018, which claims the benefit under 35 USC 119(a) and 365(b) of Korean Patent Application No. 10-2018-0062142, filed on May 30, 2018, in the Korean Intellectual Property Office, the entire disclosures of which are incorporated herein by reference for all purposes.

TECHNICAL FIELD

The inventive concept relates to a complex for detecting gas, a method for preparing the same, a gas sensor containing the complex for detecting the gas, and a method for manufacturing the same.

BACKGROUND ART

An oxide semiconductor type gas sensor was first proposed by a professor Seiyama of Kyushu University in Japan and others in the 1960s. Since then, the oxide semiconductor type gas sensor has been widely used in fields of driver's blood alcohol level measurement, explosive gas detection, exhaust gas detection, indoor harmful gas detection, and the like as the oxide semiconductor type gas sensor has various advantages of being able to be integrated into a small size, being cheap, having high sensitivity, being fast in response, and being able to detect gas concentration as an electrical signal using a simple circuit. In addition, in recent years, as interests in human health and environmental pollution have increased, demands for indoor and outdoor environmental gas detection sensors, gas sensors for self-diagnosis of diseases, artificial olfactory sensors that may be mounted on mobile devices, and the like are also rapidly increasing. However, the oxide semiconductor type gas sensor has a fundamental problem of reacting easily with external moisture, so that performance and reliability thereof are significantly degraded. Thus, it is still difficult to commercialize the oxide semiconductor type gas sensor.

The oxide semiconductor type gas sensor detects gas through a change in resistance that occurs when reducing gas reacts with oxygen ions adsorbed on an oxide surface. When the moisture is present in an atmosphere, the moisture consumes the oxygen ions on the oxide surface first like gas to be tested, so that the sensor resistance changes and gas sensitivity decreases greatly. However, because the oxide semiconductor type gas sensor operates in the atmosphere, exposure to the moisture is not able to be avoided, and humidity varies greatly depending on a weather, a season, and a region, so that it is almost impossible to secure stable gas sensing characteristics without reducing humidity dependence of the sensor. In particular, humidity of the atmosphere is generally about thousands to tens of thousands of ppm, which is very high compared to general concentration (several to tens of ppm) of the gas to be tested by the gas sensor. Thus, the changes in the resistance and in the sensitivity resulted from the humidity should be considered as the most important factor in securing reliability of the sensor. The remarkable performance and reliability degradation of the oxide semiconductor type gas sensor resulted from the humidity remains an unsolved challenge for about 50 years since the gas sensor was proposed, and acts as a major factor hindering the commercialization of the sensor. In other words, development of a highly reliable gas sensor that exhibits constant gas sensitivity and sensor resistance regardless of presence and concentration of the moisture is a first task that must be decided to increase the reliability of the sensor and to use the sensor in various applications.

Specifically, because the moisture in the atmosphere causes a reaction like the gas to be detected on a surface of the oxide semiconductor, the sensor resistance and the gas sensitivity are greatly changed by the humidity change, and the gas sensitivity decreases to one of several to tens in a high humidity atmosphere, which are serious problems. Therefore, recently, humidity stability of a sensor material has emerged as the biggest issue in the field of the oxide semiconductor type gas sensor. However, in equal to or more than 99% of existing studies on the oxide semiconductor type gas sensor, the gas sensing characteristics in a dry atmosphere are evaluated. In addition, there are few studies on the gas sensor in the high humidity atmosphere. The reason why many studies on such important issue have not been made is that the better the sensitive material, which has the high gas sensitivity, the higher the reactivity with the moisture.

DETAILED DESCRIPTION OF THE INVENTION

Technical Problem

The inventive concept is to provide a highly sensitive and highly reliable complex for detecting gas and a gas sensor containing the same that may accurately measure various gases regardless of presence and concentration of moisture.

The problem to be solved by the inventive concept is not limited thereto, and other problems that are not mentioned will be clearly understood by those skilled in the art from a following description.

Technical Solution

The inventive concept provides a complex for detecting gas responsive to the gas to be tested. According to an embodiment, the complex for detecting the gas contains a nanostructure made of an oxide semiconductor, and a Terbium (Tb) additive supported on the nanostructure.

The oxide semiconductor may be selected from a group consisting of tin oxide ($SnO_2$), zinc oxide (ZnO), and indium oxide ($In_2O_3$).

The nanostructure may have a hollow structure or an egg yolk structure.

The oxide semiconductor may be made of tin oxide ($SnO_2$), and the terbium (Tb) additive may be supported in an amount from 0.5 at % to 20 at % based on a total amount of tin (Sn) of the nanostructure.

The gas to be tested may be reducing gas selected from a group consisting of acetone, carbon monoxide, ammonia, toluene, xylene, benzene, and mixtures thereof.

In addition, the inventive concept provides a gas sensor for detecting gas. According to an embodiment, the gas sensor includes a substrate, a sensing layer disposed on the substrate and containing a complex for detecting gas responsive to the gas to be tested, and a terbium (Tb) layer disposed on the sensing layer, and the complex for detecting the gas contains a nanostructure made of an oxide semiconductor.

A thickness of the terbium (Tb) layer may be equal to or greater 50 nm and equal to or less than 250 nm.

The complex for detecting the gas may further contain a Terbium (Tb) additive supported on the nanostructure.

The oxide semiconductor may be selected from a group consisting of tin oxide ($SnO_2$), zinc oxide (ZnO), and indium oxide ($In_2O_3$).

The nanostructure may have a hollow structure or an egg yolk structure.

In addition, the inventive concept provides a complex for detecting gas. According to an embodiment, the method for preparing the complex for detecting the gas includes a solution preparing step of preparing solution containing at least one salt selected from a group consisting of tin (Sn) salt, zinc (Zn) salt, and indium (In) salt, terbium (Tb) salt, and an organic acid or sugar, an ultrasonic spray pyrolysis step of performing an ultrasonic spray pyrolysis reaction by spraying the solution through an ultrasonic spray pyrolysis apparatus, and an obtaining step of obtaining fine powders as a result of the ultrasonic spray pyrolysis reaction.

The tin (Sn) salt may be selected from a group consisting of $SnC_2O_4$, $SnCl_4 \cdot xH_2O$, and mixtures thereof, the zinc (Zn) salt may be selected from a group consisting of $Zn(NO_3)_2 \cdot xH_2O$ and mixtures thereof, the indium (In) salt may be selected from a group consisting of $In(NO_3)_3 \cdot xH_2O$ and mixtures thereof, the terbium (Tb) salt may be selected from a group consisting of $TbCl_3 \cdot 6H_2O$ and mixtures thereof, the organic acid may be selected from a group consisting of citric acid and mixtures thereof, and the sugar may be selected from a group consisting of sucrose and mixtures thereof.

The ultrasonic spray pyrolysis step may include spraying the solution prepared from the solution preparing step into an electric furnace heated at a temperature equal to or higher than 700° C. and equal to or lower than 1000° C. at a spray speed equal to or higher than 5 L/m and equal to or lower than 20 L/m.

Advantageous Effects of the Invention

The highly sensitive and highly reliable complex for detecting the gas and the gas sensor containing the same according to an embodiment of the inventive concept may accurately measure the various gases regardless of the presence and the concentration of the moisture.

BEST MODE

Figure 1:
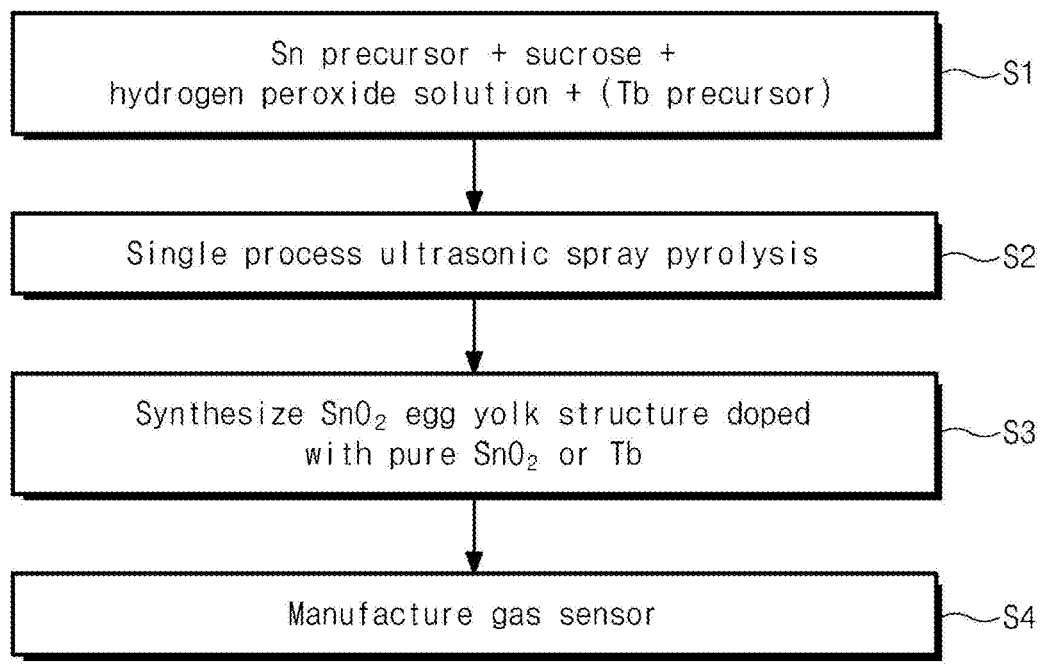
FIG. 1 is a schematic flowchart of a method for manufacturing egg yolk structure gas sensors according to Present Example 1-1, Present Example 1-2, Present Example 1-3, and Comparative Example 1 using ultrasonic spray pyrolysis.

Hereinafter, an embodiment of the inventive concept will be described in more detail with reference to the accompanying drawings. Embodiments of the inventive concept may be modified in various forms, and a scope of the inventive concept should not be construed as being limited to following embodiments. This embodiment is provided to more completely explain the inventive concept to those of ordinary skill in the art. Therefore, a shape of each of elements in the drawings is exaggerated to emphasize more clear description.

The inventive concept provides a complex for detecting gas responsive to gas to be tested based on an oxide semiconductor nanostructure in which terbium (Tb) is doped and/or added as a catalyst layer to solve the problems of the prior art as described above. In this connection, the oxide semiconductor nanostructure plays a role of a main gas susceptor for the gas to be tested, and the added terbium (Tb) selectively absorbs and removes moisture introduced from the outside.

It has been reported that the terbium (Tb) may play a role in further improving an efficiency of $CeO_2$ used as a three-way catalyst for automobiles by exhibiting excellent oxygen-accepting capacity through excellent valence conversion capability. Therefore, in the inventive concept, it was determined that a reverse reaction of following Reaction Formula 1, which is a moisture absorption reaction, may be induced when the terbium (Tb) is added to the gas susceptor. As a result of the measurement, humidity dependence of a sensor actually decreased to an insignificant level.

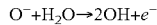
$$O^- + H_2O \rightarrow 2OH + e^-$$   <Reaction Formula 1>

Therefore, the complex for detecting the gas according to an embodiment of the inventive concept contains the nanostructure made of the oxide semiconductor and the terbium (Tb) additive supported on the nanostructure.

The nanostructure is selected from a group consisting of tin oxide ($SnO_2$), zinc oxide (ZnO), and indium oxide ($In_2O_3$). As will be described later, the nanostructure may be made of commercial nano fine powders, egg yolk structure fine powders, hollow structure fine powders, or the like.

In addition, the terbium (Tb) additive may be used as a doped and catalyst layer of the nanostructure for effective protection against the moisture and for minimization of an effect on a gas sensing reaction.

Furthermore, when being doped, the terbium (Tb) additive may be supported in an amount from 0.5 at % to 20 at % based on a total element amount of tin (Sn) of the nanostructure. However, when the atomic percent of the terbium (Tb) additive is less than 5 at %, the effect of protecting the gas susceptor from the moisture may be insignificant, and when the atomic percent of the terbium (Tb) additive exceeds 15 at %, a resistance of the sensor may be significantly increased. Therefore, preferably, when being doped, the terbium (Tb) additive may be supported in the amount from 5 at % to 15 at % based on the total element amount of the tin (Sn) of the nanostructure.

In one example, the complex for detecting the gas according to the inventive concept may be used to detect various reducing gases selected from a group consisting of acetone, carbon monoxide, ammonia, toluene, xylene, benzene, and mixtures thereof.

In addition, the inventive concept provides a method for preparing the complex for detecting the gas. The method according to the inventive concept includes:
a) a solution preparing step of preparing solution containing at least one salt selected from a group consisting of tin (Sn) salt, zinc (Zn) salt, and indium (In) salt; terbium (Tb) salt; and an organic acid or sugar;
b) an ultrasonic spray pyrolysis step of performing an ultrasonic spray pyrolysis reaction by spraying the solution through an ultrasonic spray pyrolysis apparatus; and
c) an obtaining step of obtaining fine powders as a result of the ultrasonic spray pyrolysis reaction.

Although not limited thereto, the tin (Sn) salt is selected from a group consisting of $SnC_2O_4$, $SnCl_4 \cdot xH_2O$, and mixtures thereof; the zinc (Zn) salt is selected from a group consisting of $Zn(NO_3)_2 \cdot xH_2O$ and mixtures thereof; the indium (In) salt is selected from a group consisting of $In(NO_3)_3 \cdot xH_2O$ and mixtures thereof; and the terbium (Tb) salt is selected from a group consisting of $TbCl_3 \cdot 6H_2O$ and mixtures thereof.

In this connection, when the terbium (Tb) is added to the nanostructure having the egg yolk structure using the tin (Sn) salt, the sugar is added to the solution in step a). The sugar may be selected from a group consisting of sucrose and mixtures thereof.

In addition, when the terbium (Tb) is added to the nanostructure having the hollow structure using the tin (Sn) salt, the zinc (Zn) salt, and the indium (In) salt, the organic acid and the sugar are added thereto. The organic acid may be selected from a group consisting of citric acid and mixtures thereof, and the sugar may be selected from a group consisting of the sucrose and the mixtures thereof.

In one example, the ultrasonic spray pyrolysis reaction may be performed under a condition of spraying the solution prepared in step a) into an electric furnace heated at a temperature between 700° C. and 1000° C. at a spray speed between 5 L/m and 20 L/m. In this step, fine droplets are generated by spraying the spray solution. A size of the fine droplet may be controlled by a pressure inside the spray apparatus, concentration of the spray solution, viscosity of the spray solution, intensity of an ultrasonic wave, and the like.

In addition, the inventive concept provides a gas sensor for detecting gas containing the complex for detecting the gas as a gas sensing layer. Such a gas sensor may be manufactured through
a) a complex solution preparing step of preparing solution containing the complex for detecting the gas and a binder; and
b) a sensing layer forming step of forming the sensing layer by coating, drying, and heat treating the solution on a substrate.

In this connection, the coating may be performed by a drop coating process or a screen printing process.

The terbium (Tb) catalyst layer may be additionally deposited on the sensing layer of the gas sensor for detecting the gas. The terbium (Tb) catalyst layer may be deposited in a following method. For example, the catalyst layer may be formed through electron beam evaporation, sputtering, or atomic layer deposition. Next, heating, that is, the heat treatment may be accompanied as needed to remove organic contaminants and the like and to stabilize an incomplete phase. For example, a process of the heat treatment at a temperature between 100° C. and 600° C. may be performed.

Hereinafter, the inventive concept will be described in more detail through an embodiment, but a following embodiment is only intended to aid understanding of the inventive concept, and does not limit the scope of the inventive concept.

Because the acetone is indoor and outdoor environmental pollutant gas, and at the same time, is biomarker gas that is detected from exhalation of a person suffering from diabetes, it is a very important to selectively detect the acetone regardless of presence or absence of the moisture. Therefore, in a following embodiment, the acetone was selected as main gas to be measured, and effects of the external moisture on a sensor resistance, a gas sensitivity, and the like of the sensor were analyzed.

Figure 2:
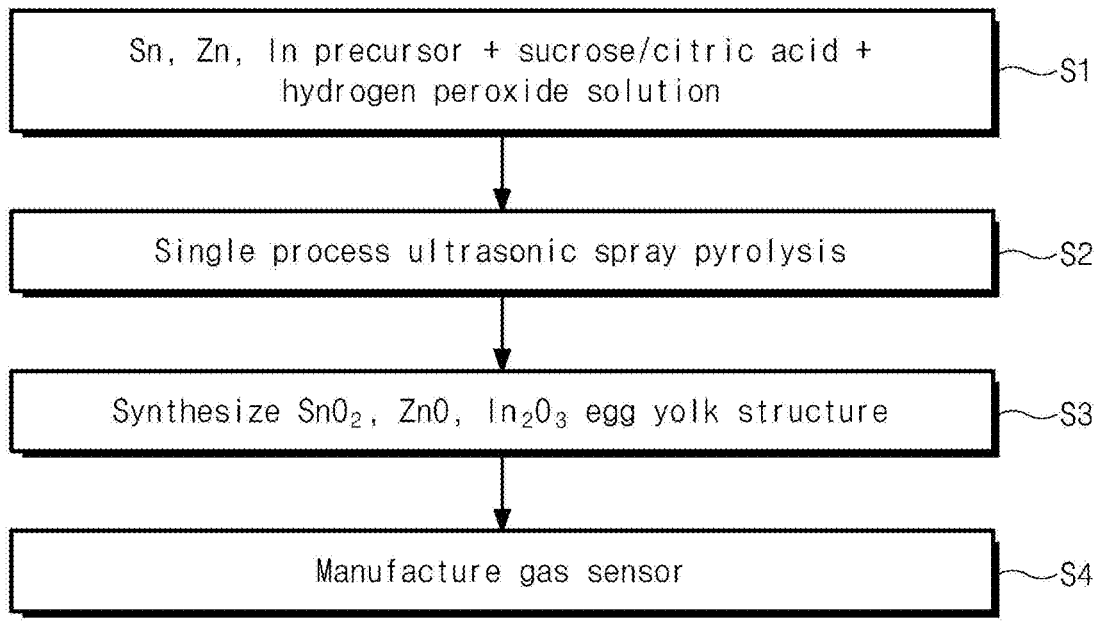
FIG. 2 is a schematic flowchart of a method for manufacturing hollow structure gas sensors according to Comparative Example 2, Comparative Example 3, and Comparative Example 4 using ultrasonic spray pyrolysis.
Figure 3:
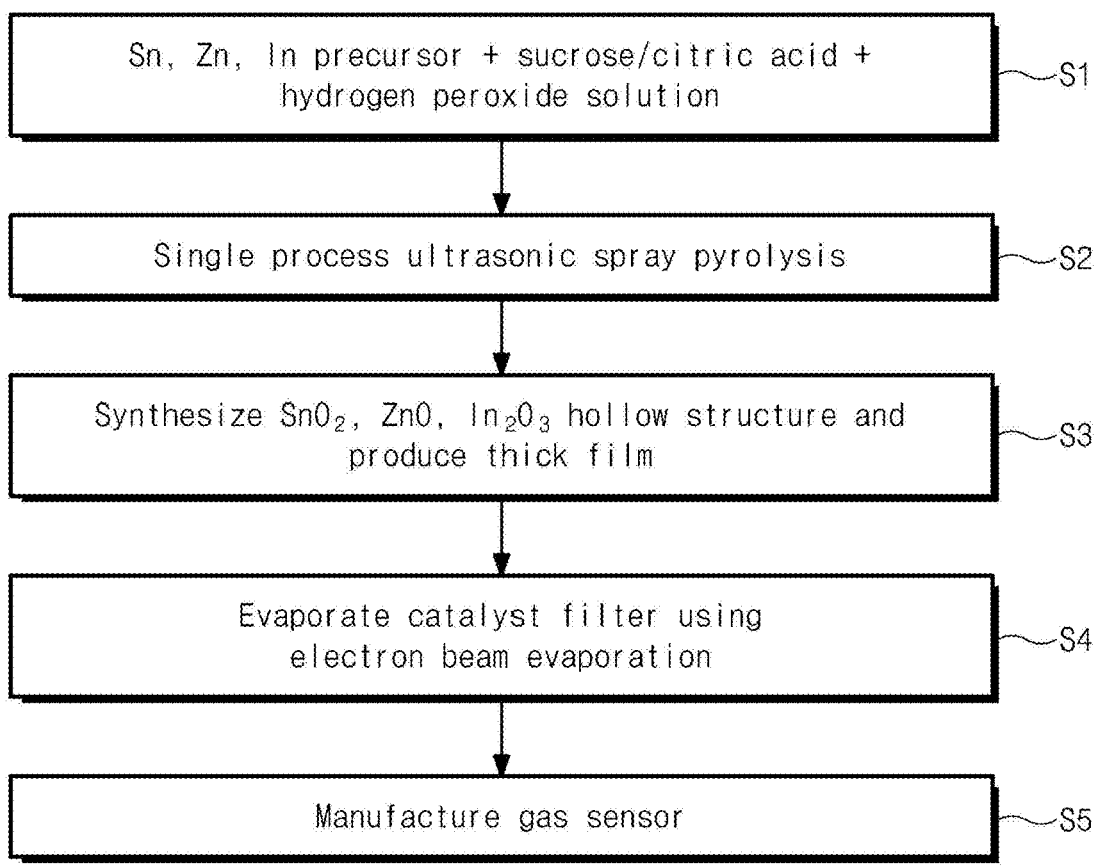
FIG. 3 is a schematic flowchart of a method for manufacturing hollow structure gas sensors including a Tb catalyst layer according to Present Examples 2, 3, and 4 using ultrasonic spray pyrolysis.

In the inventive concept, gas sensors according to Comparative Examples are manufactured using egg yolk structure fine powders (Comparative Example 1) and hollow structure fine powders (Comparative Example 2) of pure tin oxide ($SnO_2$), hollow structure fine powders of pure zinc oxide (ZnO) (Comparative Example 3), and hollow structure fine powders of pure indium oxide ($In_2O_3$) (Comparative Example 4). In addition, gas sensors of tin oxide ($SnO_2$) egg yolk structures doped with the terbium (Tb) of 1 at % (Present Example 1-3), 5 at % (Present Example 1-1), and 15 at % (Present Example 1-2) based on the total element amount of the tin (Sn), pure tin oxide ($SnO_2$) hollow structure on which the terbium (Tb) catalyst layer of 100 nm is deposited (Present Example 2), pure zinc oxide (ZnO) hollow structure on which the terbium (Tb) catalyst layer of 100 nm is deposited (Present Example 3), and pure indium oxide ($In_2O_3$) hollow structure on which the terbium (Tb) catalyst layer of 100 nm is deposited (Present Example 4). For the gas sensors manufactured as described above, the humidity dependences, the gas sensitivities, the sensor resistances, and the like of the sensors were compared with each other. FIGS. 1 to 3 respectively illustrate a process chart of a method for manufacturing the egg yolk structure gas sensors according to Present Example 1-1, Present Example 1-2, Present Example 1-3, and Comparative Example 1 using the ultrasonic spray pyrolysis (FIG. 1), a process chart of a method for manufacturing the hollow structure gas sensors according to Comparative Example 2, Comparative Example 3, and Comparative Example 4 using the ultrasonic spray pyrolysis (FIG. 2), and a process chart of a method for manufacturing the gas sensors by coating the catalyst layers containing the terbium (Tb) on sensitive films according to Comparative Example 2, Comparative Example 3, and Comparative Example 4 (FIG. 3).

Comparative Example 1, Present Example 1-1, Present Example 1-2, and Present Example 1-3

First, 30 ml of hydrogen peroxide solution ($H_2O_2$, 30 wt % in $H_2O$) was added to 270 ml of distilled water to prepare final 300 ml of solution. Then, tin oxalate ($SnC_2O_4$) corresponding to 0.1 M was mixed with the prepared solution and then stirred for 24 hours. The sucrose corresponding to 0.5 M was mixed with such solution and then stirred for 5 minutes to prepare the spray solution. Tb chloride hexahydrate was added into the prepared spray solution such that an element ratio of tin (Sn)/terbium (Tb) is calculated to correspond to 100/0 (Comparative Example 1), 99/1 (Present Example 1-3), 95/5 (Present Example 1-1), and 85/15 (Present Example 1-2), stirred for 5 minutes, and then ultrasonically sprayed. The synthesized precursor was immediately heat treated while passing through the electric furnace (1000° C.) connected to a spray outlet at the same time as being sprayed at a flow rate of 5 L $min^{-1}$ (in $O_2$) to form tin oxide ($SnO_2$) egg yolk structures doped with the terbium (Tb) of 0 at % (Comparative Example 1), 1 at % (Present Example 1-3), 5 at % (Present Example 1-1), and 15 at % (Present Example 1-2) based on the total element amount of the tin (Sn). The egg yolk structure fine powders thus obtained were heat-treated at 600° C. for 2 hours. The synthesized fine powders were mixed with tertiary distilled water to form a mixture. The mixture was drop-coated on an alumina substrate on which a gold (Au) electrode was formed, and heat-treated at 500° C. for 2 hours to manufacture the gas sensor. A change in the resistance of the manufactured sensor was measured while alternately injecting, at 450° C., air in a dry atmosphere and air in an atmosphere of a relative humidity of 80%, or air+mixed gas in a dry atmosphere and air+mixed gas in the atmosphere of the relative humidity of 80% thereto. The gas was mixed in advance and then concentration thereof was rapidly changed using a 4-way valve. A total flow rate was fixed at 200 sccm, so that there was no temperature difference when the gas concentration was changed.

Comparative Example 2 and Present Example 2

First, 3 mL of hydrochloric acid (HCl, between 35.0% and 37.0%) was added to 297 mL of the distilled water to form a mixture. 0.1 M of tin chloride and 0.025 M of citric acid monohydrate were added into the mixture, stirred for 5 minutes, and then ultrasonically sprayed. Micro-sized droplets formed through the ultrasonic wave passed through a 700° C. reactor at a flow rate of 20 L $min^{-1}$ (in air), and the tin oxide ($SnO_2$) hollow structure was formed (Comparative Example 2). The hollow structure fine powders thus obtained are mixed with an organic binder to form a mixture. The mixture is screen-printed on the alumina substrate on which the gold (Au) electrode is formed, dried at 70° C. for 2 hours, and then heat-treated at 600° C. for 2 hours to produce a $SnO_2$ gas sensitive film. Thereafter, the $SnO_2$ gas sensitive film was deposited to have a thickness of 100 nm using a terbium source through an electron beam evaporator, and then heat-treated at 550° C. for 2 hours to manufacture a tin oxide ($SnO_2$) gas sensor on which the terbium (Tb) is applied (Present Example 2). Gas sensitivity measurement of the manufactured gas sensor is the same as in Present Example 1-1, but only the measuring temperature was changed to 400° C.

Comparative Example 3 and Present Example 3

First, 0.2 M zinc nitrate hydrate was added to 300 mL of the distilled water, stirred for 5 minutes, and then ultrasonically sprayed. Micro-sized droplets formed through the ultrasonic wave passed through the 700° C. reactor at the flow rate of 20 L $min^{-1}$ (in air), and the zinc oxide (ZnO) hollow structure was formed (Comparative Example 3). The hollow structure fine powders thus obtained were mixed with the organic binder to form a mixture. The mixture is screen-printed on the alumina substrate on which the gold (Au) electrode is formed, dried at 70° C. for 2 hours, and then heat-treated at 600° C. for 2 hours to produce a zinc oxide (ZnO) gas sensitive film. Thereafter, the ZnO gas sensitive film was deposited to have a thickness of 100 nm using the terbium source through the electron beam evaporator, and then heat-treated at 550° C. for 2 hours to manufacture a ZnO gas sensor on which the Tb is applied (Present Example 3). The gas sensitivity measurement of the manufactured gas sensor is the same as in Present Example 2.

Comparative Example 4 and Present Example 4

First, 0.05 M of indium nitrate hydrate and 0.15 M of the sucrose were added to 300 mL of the distilled water, stirred for 5 minutes, and then ultrasonically sprayed. Micro-sized droplets formed through the ultrasonic wave passed through the 900° C. reactor at the flow rate of 20 L min⁻¹ (in air), and the indium oxide ($In_2O_3$) hollow structure was formed (Comparative Example 3). The hollow structure fine powders thus obtained were mixed with the organic binder to form a mixture. The mixture is screen-printed on the alumina substrate on which the gold (Au) electrode is formed, dried at 70° C. for 2 hours, and then heat-treated at 600° C. for 2 hours to produce an indium oxide ($In_2O_2$) gas sensitive film. Thereafter, the $In_2O_2$ gas sensitive film was deposited to have a thickness of 100 nm using the terbium source through the electron beam evaporator, and then heat-treated at 550° C. for 2 hours to manufacture an $In_2O_3$ gas sensor on which the terbium (Tb) is applied (Present Example 4). The gas sensitivity measurement of the manufactured gas sensor is the same as in Present Example 2.

Comparative Example 5 and Present Example 5

First, tin oxide ($SnO_2$) commercial fine powders (Comparative Example 5) and Tb chloride hexahydrate were added into 20 mL of the distilled water such that the element ratio of the tin (Sn)/terbium (Tb) is calculated to correspond to 95/5, and then, stirred at a temperature of 80° C. for 2 hours. Such solution was dried in an electric oven at 70° C. for 24 hours and then heat-treated in the electric furnace at 600° C. for 2 hours (Present Example 5). Thereafter, the method for manufacturing the sensor and the gas sensitivity measurement were performed in the same manner as in Present Example 1-1.

Comparative Example 6 and Present Example 6

First, indium oxide ($In_2O_3$) commercial fine powders (Comparative Example 6) and the Tb chloride hexahydrate were added into 20 mL of the distilled water such that an element ratio of indium (In)/terbium (Tb) is calculated to correspond to 97.5/2.5, and then, stirred at a temperature of 80° C. for 2 hours. Such solution was dried in the electric oven at 70° C. for 24 hours and then heat-treated in the electric furnace at 600° C. for 2 hours (Present Example 6). Thereafter, the method for manufacturing the sensor and the gas sensitivity measurement were performed in the same manner as in Present Example 1-1.

As a result of evaluation of gas sensing characteristics by manufacturing the sensor with the fine powders synthesized in the method as described above, all of Present Example 1-1, Present Example 1-2, Present Example 1-3, Present Example 2, Present Example 3, Present Example 4, Present Example 5, Present Example 6, Comparative Example 1, Comparative Example 2, Comparative Example 3, Comparative Example 4, Comparative Example 5, and Comparative Example 6 showed n-type semiconductor characteristics in which the resistance decreases at the same time when the acetone is introduced after exhibiting a high resistance state in the air. Therefore, in a case of an n-type oxide semiconductor, the gas sensitivity was defined as Ra/Rg (Ra: the sensor resistance in air, Rg: the sensor resistance in gas). Acetone sensing characteristics of each manufactured sensor were measured in the dry atmosphere and compared with acetone sensitivity and sensor resistance thereof measured in the atmosphere of the relative humidity of 80%. A detailed measurement method is as follows.

After the sensor's resistance Ra became constant in air in the dry atmosphere, the atmosphere was suddenly changed to an atmosphere of the gas to be tested (from 10 ppm to 20 ppm of the acetone), and then the sensor was exposed to the gas to be tested. Thereafter, when the resistance in the gas became constant (Rg), the atmosphere was changed to the air in the dry atmosphere and then the gas sensitivity in the dry atmosphere was measured. Thereafter, the atmosphere was suddenly changed to the air with the atmosphere of the relative humidity of 80%. The sensor was exposed to the gas to be tested with the relative humidity of 80%, and gas sensing characteristics based on a first humidity were evaluated. In addition, a value obtained by dividing the gas sensitivity of the atmosphere of the 80% relative humidity by the gas sensitivity of the dry atmosphere was defined as a rate of change in the gas sensitivity. Further, a value obtained by dividing the sensor resistance of the 80% relative humidity by the sensor resistance of the dry atmosphere was defined as a rate of change in the sensor resistance. Therefore, when the rate of changes in the gas sensitivity and the sensor resistance are 1, it may be determined that the sensor has little humidity dependence.

Figure 4:
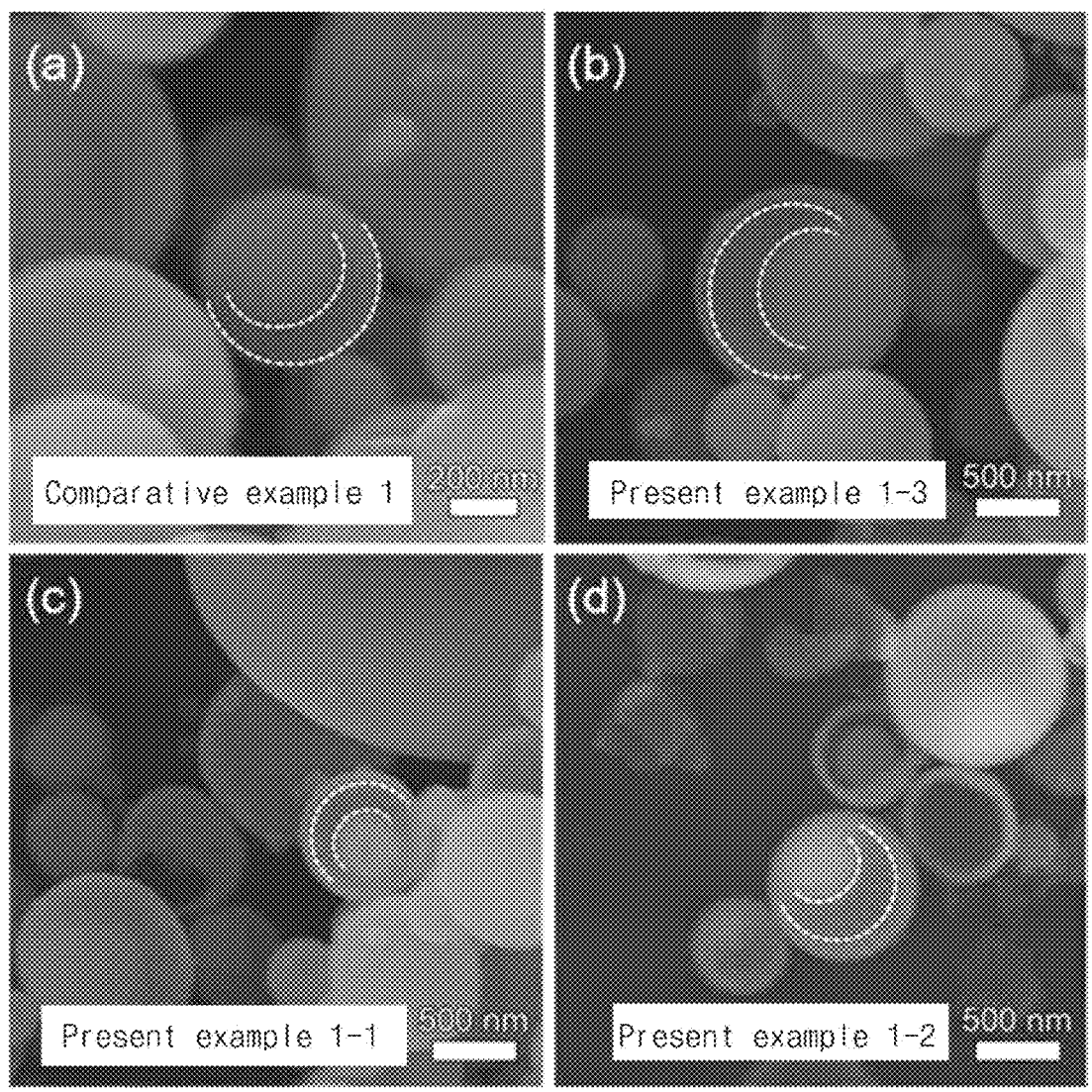
FIG. 4 shows scanning electron microscope (SEM) photographs of egg yolk structure fine powders of pure tin oxide ($SnO_2$) (Comparative Example 1, FIG. 4A), and $SnO_2$ doped with terbium (Tb) of 1 at % (Present Example 1-3, FIG. 4B), 5 at % (Present Example 1-1, FIG. 4C), and 15 at % (Present Example 1-2, FIG. 4D) synthesized through ultrasonic spray pyrolysis.

FIG. 4 shows scanning electron microscope (SEM) photographs of egg yolk structure fine powders of pure tin oxide ($SnO_2$) (Comparative Example 1, FIG. 4A), and tin oxide ($SnO_2$) doped with terbium (Tb) of 1 at % (Present Example 1-3, FIG. 4B), 5 at % (Present Example 1-1, FIG. 4C), and 15 at % (Present Example 1-2, FIG. 4D) synthesized through ultrasonic spray pyrolysis. Referring to FIG. 4, it may be seen that all Present Examples and Comparative Examples have the egg yolk structure with the additional hollow structure defined therein, and sizes of the nanostructures are uniform.

Figure 5:
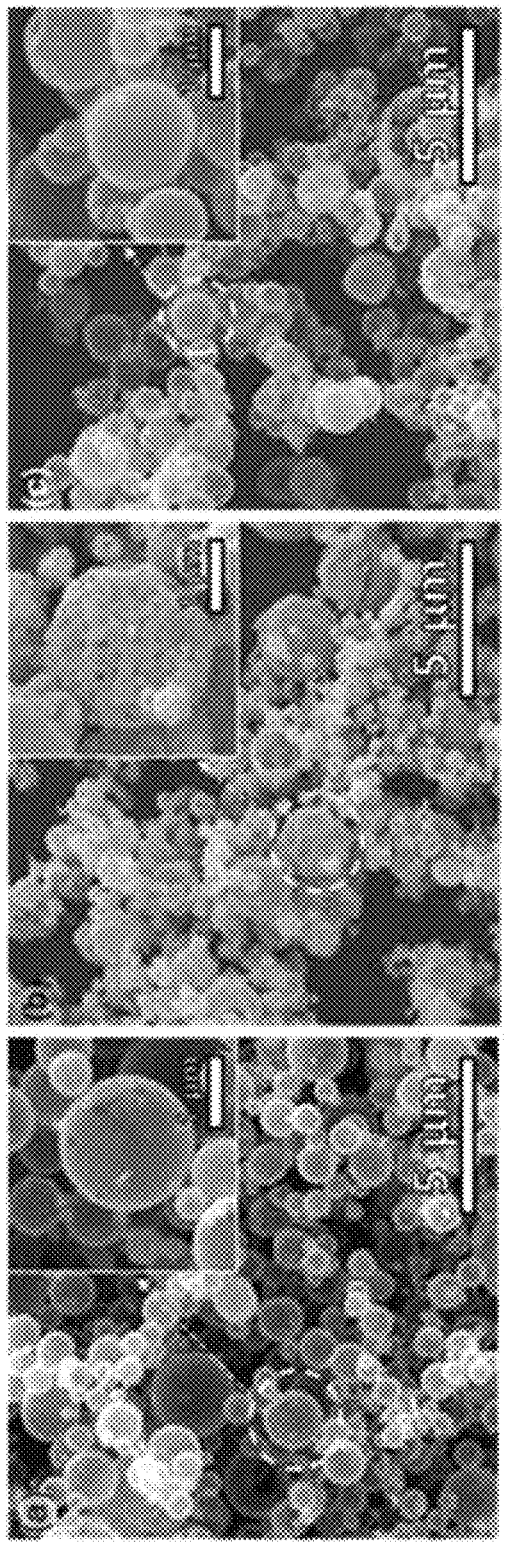
FIG. 5 shows SEM photographs of hollow structure fine powders of tin oxide ($SnO_2$) (Comparative Example 2, FIG. 5A), zinc oxide (ZnO) (Comparative Example 3, FIG. 5B), and indium oxide ($In_2O_3$) (Comparative Example 4, FIG. 5C).

FIG. 5 shows SEM photographs of hollow structure fine powders of tin oxide ($SnO_2$) (Comparative Example 2, FIG. 5A), zinc oxide (ZnO) (Comparative Example 3, FIG. 5B), and indium oxide ($In_2O_3$) (Comparative Example 4, FIG. 5C). Referring to FIG. 5, it may be seen that Comparative Example 2, Comparative Example 3, and Comparative Example 4 have the hollow structure with an empty interior.

Figure 6:
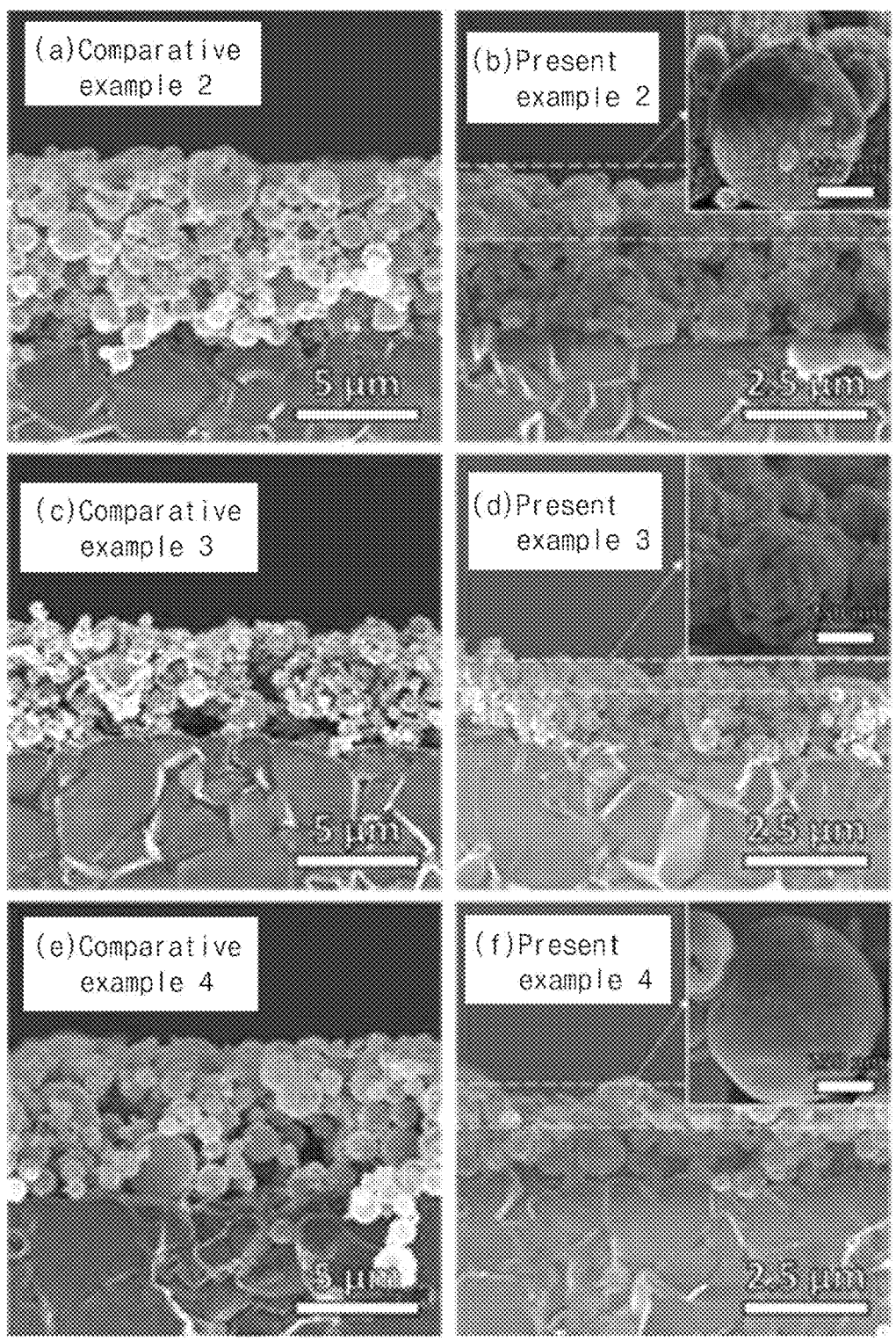
FIG. 6 shows SEM images of a sensor sensitive film for Comparative Example 2 (FIG. 6A), Comparative Example 3 (FIG. 6C), Comparative Example 4 (FIG. 6E), Present Example 2 (FIG. 6B), Present Example 3 (FIG. 6D), and Present Example 4 (FIG. 6F).

FIG. 6 shows SEM images of a sensor sensitive film for Comparative Example 2 (FIG. 6A), Comparative Example 3 (FIG. 6C), Comparative Example 4 (FIG. 6E), Present Example 2 (FIG. 6B), Present Example 3 (FIG. 6D), and Present Example 4 (FIG. 6F). Referring to FIG. 6, it may be seen that the terbium catalyst layer is uniformly deposited on the upper sensitive film through the electron beam evaporator (FIGS. 6B, 6D, and 6F).

Figure 7:
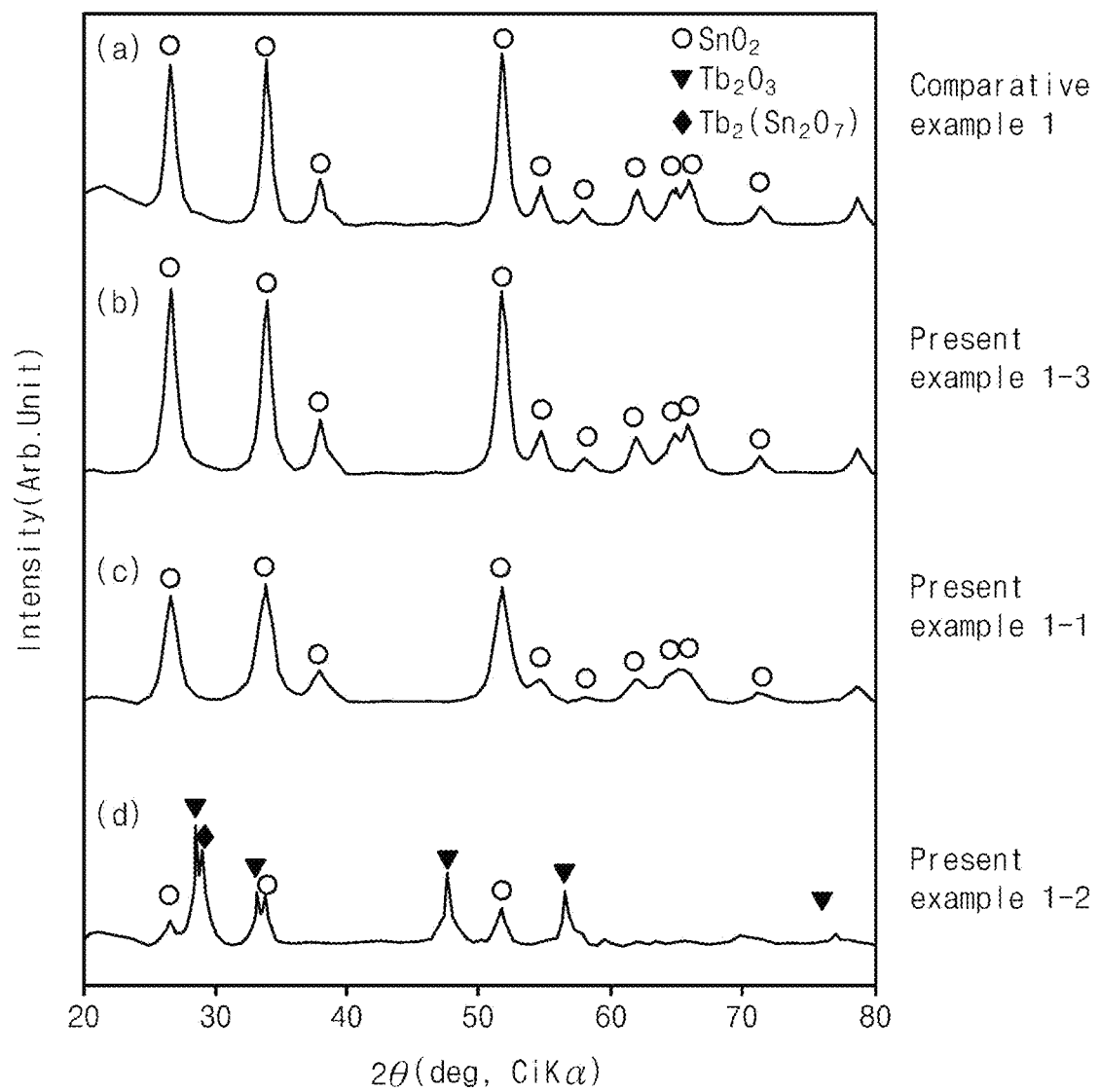
FIG. 7 is an analysis result of X-ray images of fine powders according to Comparative Example 1 (FIG. 7A), Present Example 1-1 (FIG. 7B), Present Example 1-2 (FIG. 7C), and Present Example 1-3 (FIG. 7D).

FIG. 7 is an analysis result of X-ray images of fine powders according to Comparative Example 1 (FIG. 7A), Present Example 1-1 (FIG. 7B), Present Example 1-2 (FIG. 7C), and Present Example 1-3 (FIG. 7D). Referring to FIG. 7, X-ray diffraction patterns of Comparative Example 1 (FIG. 7A) and Present Examples 1-1 to 1-3 (FIGS. 7B to 7D) showed tin oxide ($SnO_2$) of a tetragonal structure. Although 1 at % and 5 at % of the terbium (Tb) were added in Present Example 1-3 (FIG. 7B) and Present Example 1-1 (FIG. 7C), diffraction patterns associated with the terbium (Tb) were not identified. This is determined to be because an amount of terbium (Tb) added was very small to fail to reach an analysis limit of XRD (X-Ray Diffraction), or because the terbium (Tb) was evenly doped throughout the tin oxide ($SnO_2$) egg yolk structure. In addition, in Present Example 1-2, terbium oxide ($Tb_2O_3$) and $Tb_2$ ($Sn_2O_7$) images appeared in addition to the tin oxide ($SnO_2$) of the tetragonal structure.

Figure 8:
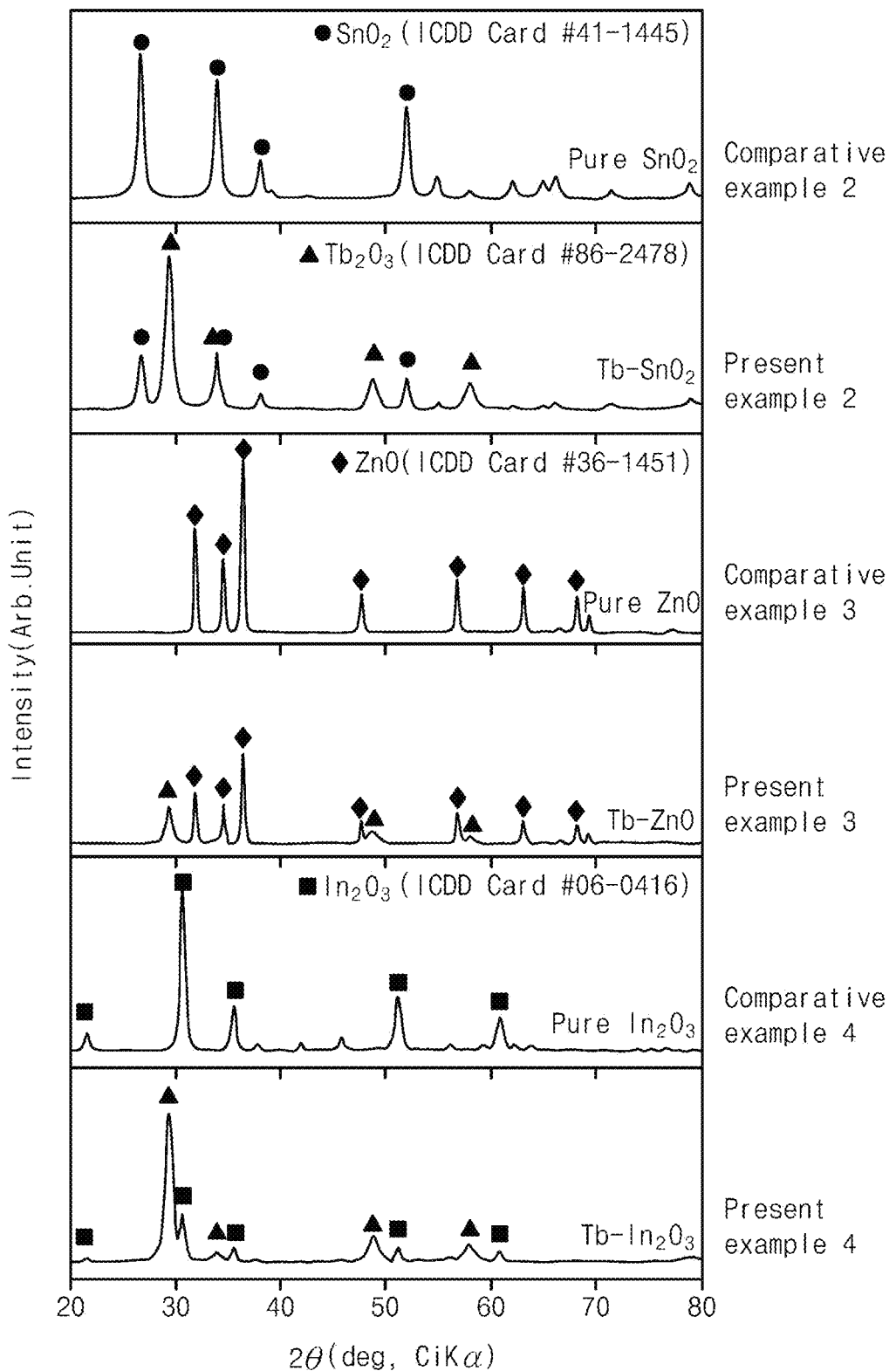
FIG. 8 is an analysis result of X-ray images of fine powders according to Comparative Example 2 (FIG. 8A), Present Example 2 (FIG. 8B), Comparative Example 3 (FIG. 8C), Present Example 3 (FIG. 8D), Comparative Example 4 (FIG. 8E), and Present Example 4 (FIG. 8F).

FIG. 8 is an analysis result of X-ray images of fine powders according to Comparative Example 2 (FIG. 8A), Present Example 2 (FIG. 8B), Comparative Example 3 (FIG. 8C), Present Example 3 (FIG. 8D), Comparative Example 4 (FIG. 8E), and Present Example 4 (FIG. 8F). Referring to FIG. 8, in Present Example 2 (FIG. 8B) in which the Tb catalyst layer was deposited on Comparative Example 2, diffraction patterns of the tin oxide ($SnO_2$) and the terbium oxide ($Tb_2O_3$) of the tetragonal structures were shown.

Further, a diffraction pattern of Comparative Example 3 (FIG. 8C) showed zinc oxide (ZnO) of a hexagonal structure. Present Example 3 (FIG. 8D) in which the terbium (Tb) catalyst layer was deposited on Comparative Example 3 showed diffraction patterns of the zinc oxide (ZnO) and the terbium oxide ($Tb_2O_3$) of the hexagonal structures.

In one example, a diffraction pattern of Comparative Example 4 (FIG. 8E) showed indium oxide ($In_2O_3$) of a cubic structure. Present Example 4 (FIG. 8F) in which the terbium (Tb) catalyst layer was deposited on Comparative Example 4 showed diffraction patterns of the indium oxide ($In_2O_3$) and the terbium oxide ($Tb_2O_3$) of the cubic structures.

Figure 9:
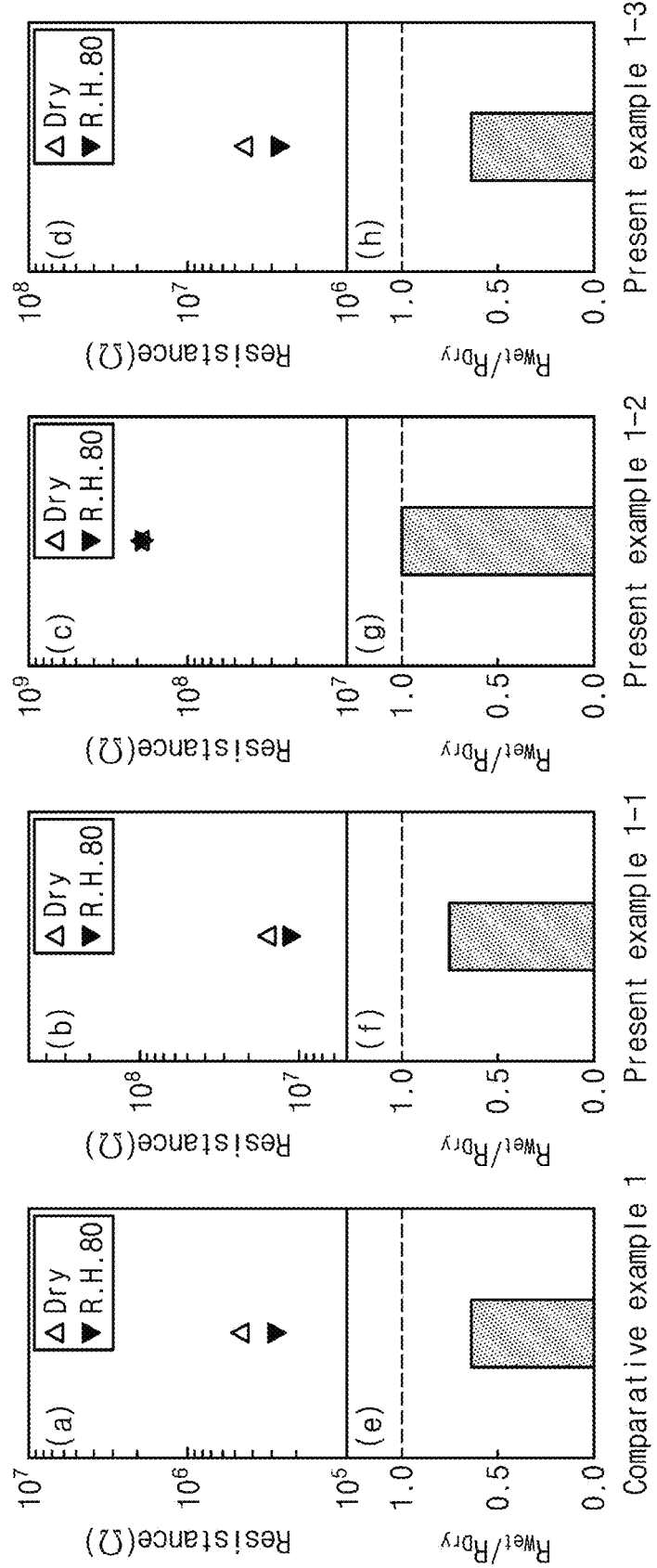
FIG. 9 shows graphs of sensor resistances (FIGS. 9A to 9D) and rates of change in the sensor resistance (FIGS. 9E to 9H) in a dry atmosphere and in an atmosphere of a relative humidity of 80% at a sensing target temperature of 450° C. of Comparative Example 1, Present Example 1-1, Present Example 1-2, and Present Example 1-3.

FIG. 9 shows graphs of sensor resistances (FIGS. 9A to 9D) and rates of change in the sensor resistance (FIGS. 9E to 9H) in a dry atmosphere and in an atmosphere of a relative humidity of 80% at a sensing target temperature of 450° C. of Comparative Example 1, Present Example 1-1, Present Example 1-2, and Present Example 1-3. Referring to FIG. 9, In Comparative Example 1, when exposed to the atmosphere of the 80% relative humidity, the sensor resistance decreased by 36.4% compared to the sensor resistance in the dry atmosphere (FIGS. 9A and 9E). This is a general phenomenon that occurs when an n-type oxide semiconductor type gas sensor such as the tin oxide ($SnO_2$) is exposed to the moisture, and is a major factor that degrades a performance of the sensor and causes malfunction. On the other hand, in Present Example 1-1, the sensor resistance decreased by 24.3% compared to the sensor resistance in the dry atmosphere even when suddenly exposed to the atmosphere of the 80% relative humidity (FIGS. 9B and 9F). In Present Example 1-2, similarly, the sensor resistance was 102.5% of a sensor resistance value in the dry atmosphere, which was almost similar, but measurement may become somewhat difficult as the sensor resistance increases (FIGS. 9C and 9G). On the other hand, in Present Example 1-3 doped with the 1 at % terbium (Tb), when exposed to the atmosphere of the 80% relative humidity, the resistance of the sensor was 65.4% of that in the dry atmosphere (FIGS. 9D and 9H).

Figure 10:
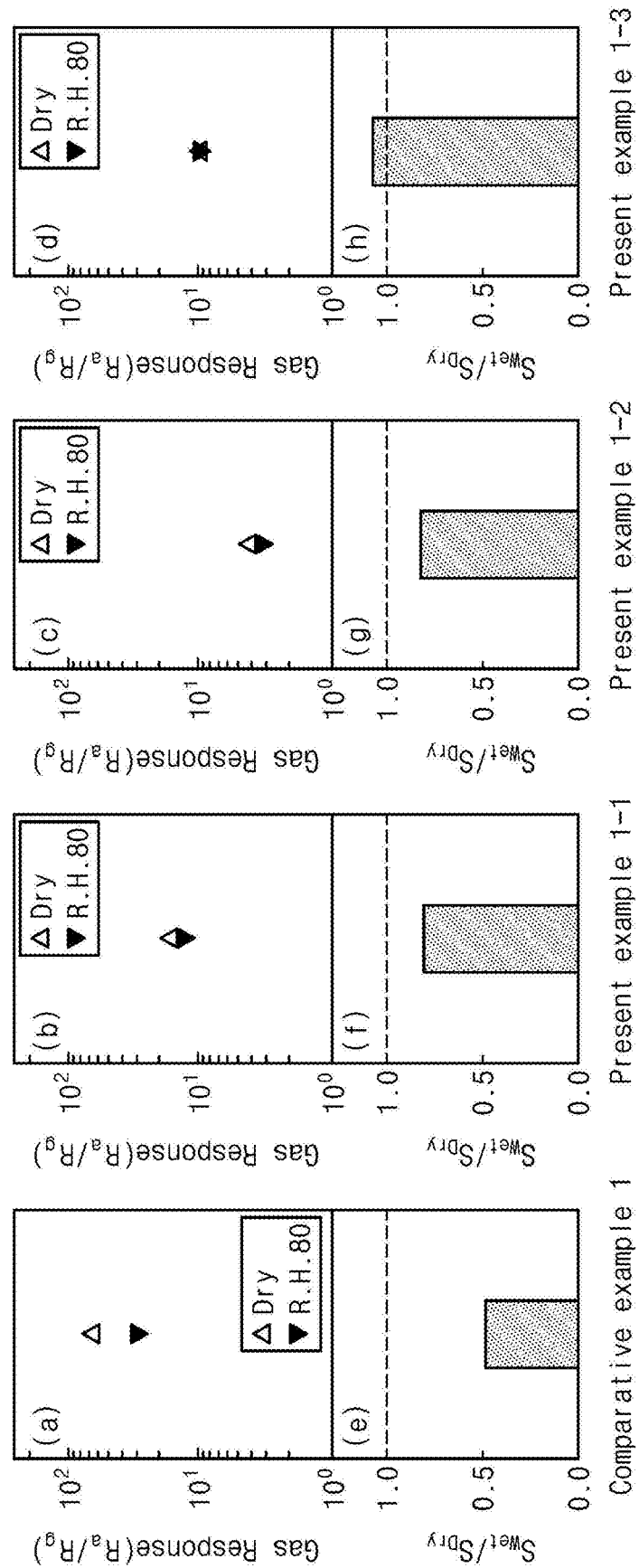
FIG. 10 shows graphs of sensor sensitivities (FIGS. 10A to 10D) and rates of change in the sensor sensitivity (FIGS. 10E to 10H) in a dry atmosphere and in an atmosphere of a relative humidity of 80% at a sensing target temperature of 450° C. of Comparative Example 1, Present Example 1-1, Present Example 1-2, and Present Example 1-3.

FIG. 10 shows graphs of sensor sensitivities (FIGS. 10A to 10D) and rates of change in the sensor sensitivity (FIGS. 10E to 10H) for 20 ppm of the acetone in a dry atmosphere and in an atmosphere of a relative humidity of 80% at a sensing target temperature of 450° C. of Comparative Example 1, Present Example 1-1, Present Example 1-2, and Present Example 1-3. In Comparative Example 1, the sensor sensitivity for 20 ppm of the acetone in the atmosphere of the 80% relative humidity was 30.7, which was reduced to be 63.6% of the sensor sensitivity of 63.9 in the dry atmosphere (FIGS. 10A and 10E). In contrast, in Present Example 1-1, the sensor sensitivity in the atmosphere of the 80% relative humidity was maintained at 12.0, which was 80.6% of the sensor sensitivity of 16 in the dry atmosphere (FIGS. 10B and 10F). In Present Example 1-2, the rate of change in the sensor sensitivity was 82%, which was not significantly affected by the humid atmosphere (FIGS. 10C and 10G). In Present Example 1-3, the sensor sensitivity in the atmosphere of the 80% relative humidity was 9.9, which was increased to be 107.6% of 9.2 in the dry atmosphere.

Considering the rate of change in the sensor resistance, the rate of change in the sensor sensitivity, the sensitivity of the sensor, and the resistance of the sensor in the dry atmosphere and in the atmosphere of the 80% relative humidity with reference to FIGS. 9 and 10, it may be seen that Present Example 1-1 shows constant gas sensing characteristics with high reliability regardless of the presence or the absence of the external moisture, and Present Example 1-2 and Present Example 1-3 significantly reduce humidity dependence of the sensing characteristics compared to Comparative Example 1.

Figure 11:
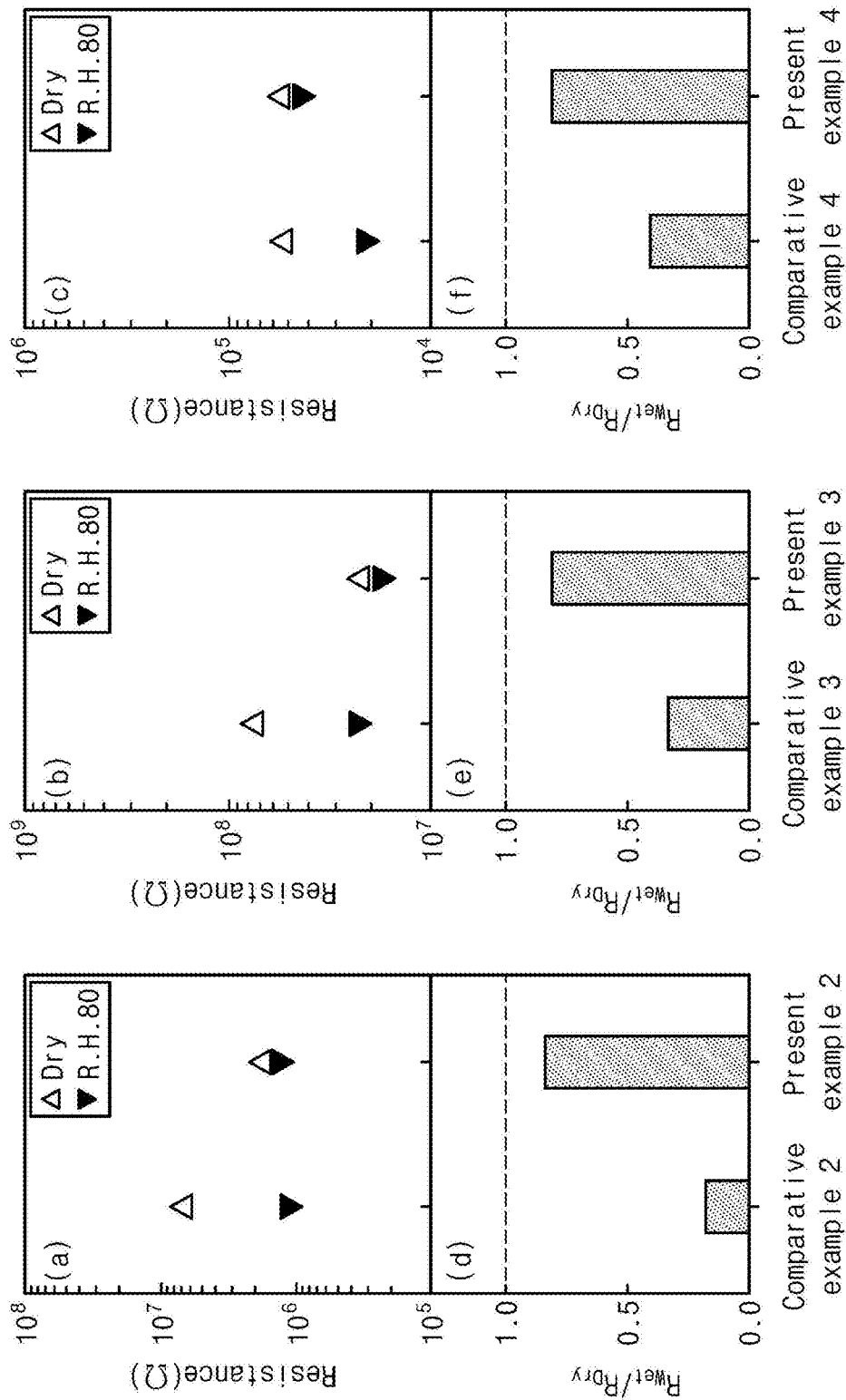
FIG. 11 shows graphs of sensor resistances (FIGS. 11A to 11C) and rates of change in the sensor resistance (FIGS. 11D to 11F) in a dry atmosphere and in an atmosphere of a relative humidity of 80% at a sensing target temperature of 450° C. of Present Example 2, Comparative Example 2, Present Example 3, Comparative Example 3, Present Example 4, and Comparative Example 4.

FIG. 11 shows graphs of sensor resistances (FIGS. 11A to 11C) and rates of change in the sensor resistance (FIGS. 11D to 11F) in a dry atmosphere and in an atmosphere of a relative humidity of 80% at a sensing target temperature of 450° C. of Present Example 2, Comparative Example 2, Present Example 3, Comparative Example 3, Present Example 4, and Comparative Example 4.

In Comparative Example 2, when exposed to the atmosphere of the 80% relative humidity, the sensor resistance decreased significantly compared to that in the dry atmosphere, so that the rate of change in the sensor resistance was 82.6%, and in Present Example 2, the resistance was not significantly reduced even in the humid atmosphere, thereby exhibiting the rate of change in the sensor resistance of 16.2% (FIGS. 11A and 11D).

In Comparative Example 3, when exposed to the atmosphere of the 80% relative humidity, the sensor resistance decreased significantly compared to that in the dry atmosphere similar to Comparative Example 2, so that the rate of change in the sensor resistance was 66.7%, and in Present Example 3, the resistance was not significantly reduced even in the humid atmosphere, thereby exhibiting the rate of change in the sensor resistance of 19.0% (FIGS. 11B and 11E).

Also, in Comparative Example 4, when exposed to the atmosphere of the 80% relative humidity, the sensor resistance decreased by 59.0% compared to that in the dry atmosphere, and in Present Example 4, the sensor resistance decreased by 19.0% in the humid atmosphere compared to that in the dry atmosphere (FIGS. 11C and 11F).

Figure 12:
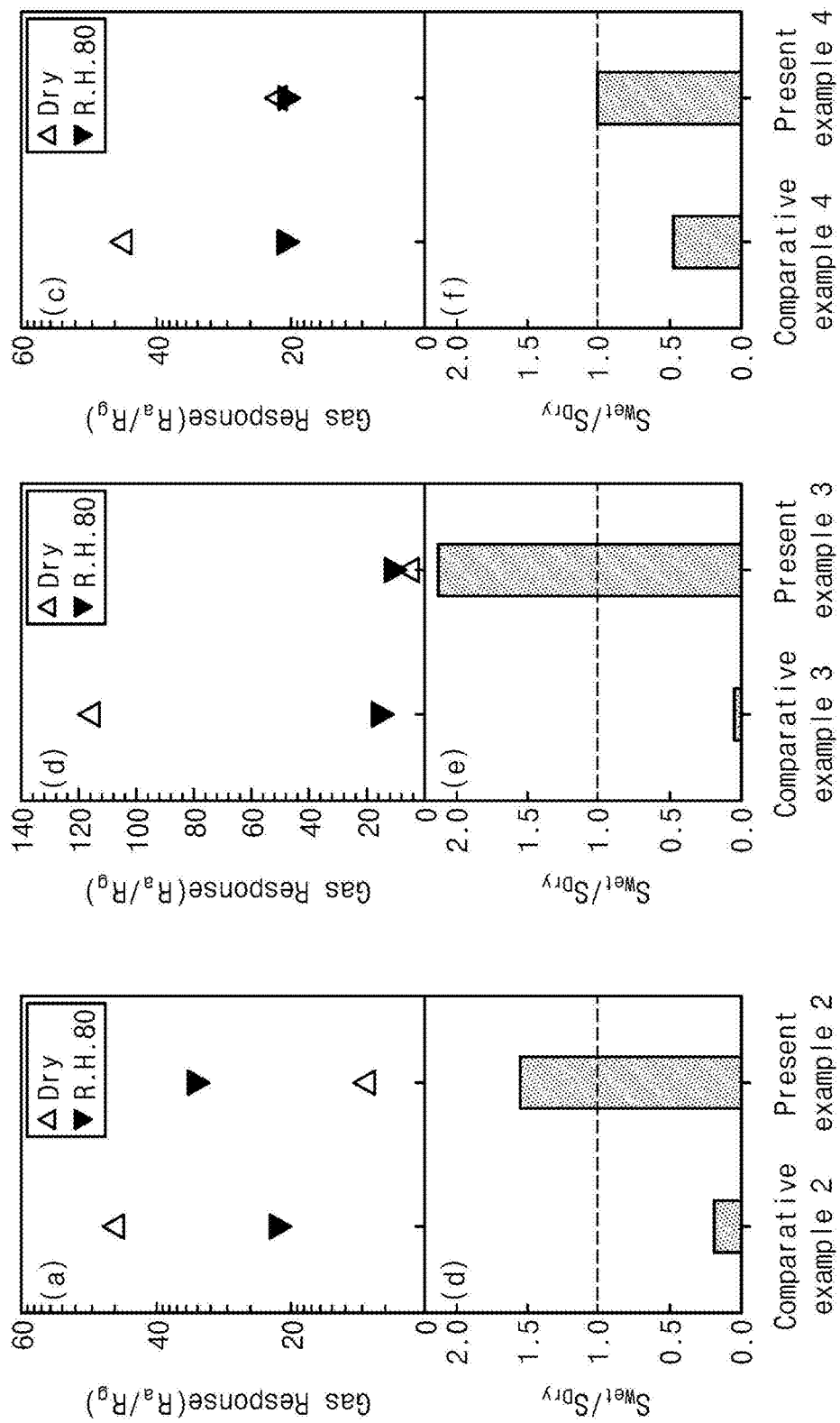
FIG. 12 shows graphs of sensor sensitivities (FIGS. 12A to 12C) and rates of change in the sensor sensitivity (FIGS. 12D to 12F) in a dry atmosphere and in an atmosphere of a relative humidity of 80% at a sensing target temperature of 450° C. of Present Example 2, Comparative Example 2, Present Example 3, Comparative Example 3, Present Example 4, and Comparative Example 4.

FIG. 12 shows graphs of sensor sensitivities (FIGS. 12A to 12C) and rates of change in the sensor sensitivity (FIGS. 12D to 12F) of 10 ppm of acetone in a dry atmosphere and in an atmosphere of a relative humidity of 80% at a sensing target temperature of 450° C. of Present Example 2, Comparative Example 2, Present Example 3, Comparative Example 3, Present Example 4, and Comparative Example 4.

In Comparative Example 2, the sensor sensitivity for 10 ppm of the acetone in the atmosphere of the 80% relative humidity was 8.8, which was reduced to be 80.6% compared to the sensor sensitivity of 45.7 in the dry atmosphere. On the other hand, in Present Example 2, the sensor sensitivity in the atmosphere of the 80% relative humidity was 34.5, which was 55.5% increased from the sensor sensitivity of 22.3 in the dry atmosphere (FIGS. 12A and 12D).

Similarly, in Comparative Example 3 and Comparative Example 4, the sensor sensitivities for 10 ppm of the acetone in the atmosphere of the 80% relative humidity were 18.1 (Comparative Example 3) and 20.8 (Comparative Example 4), respectively, which were significantly reduced from the sensor sensitivities of 116.2 (Comparative Example 3) and 44.4 (Comparative Example 4) in the dry atmosphere, respectively (FIGS. 12B, 12C, 12E, and 12F). In contrast, in Present Example 3 and Present Example 4, the sensor sensitivities for 10 ppm of the acetone in the atmosphere of the 80% relative humidity were 18.1 (Comparative Example 3) and 20.8 (Comparative Example 4), respectively, which were increased or constant compared to the sensor sensitivities of 6.2 (Comparative Example 3) and 20.8 (Comparative Example 4) in the dry atmosphere, respectively (FIGS. 12B, 12C, 12E, and 12F).

Referring to FIGS. 11 and 12, when the terbium (Tb) catalyst layer is coated on the sensor sensitive film, the rates of change in the sensor resistance and in the sensor sensitivity in the dry atmosphere and in the atmosphere of the 80% relative humidity may be adjustable. This means that a sensor that exhibits the constant gas sensing characteristics with the high reliability regardless of the presence or the absence of the external moisture may be designed.

Figure 13:
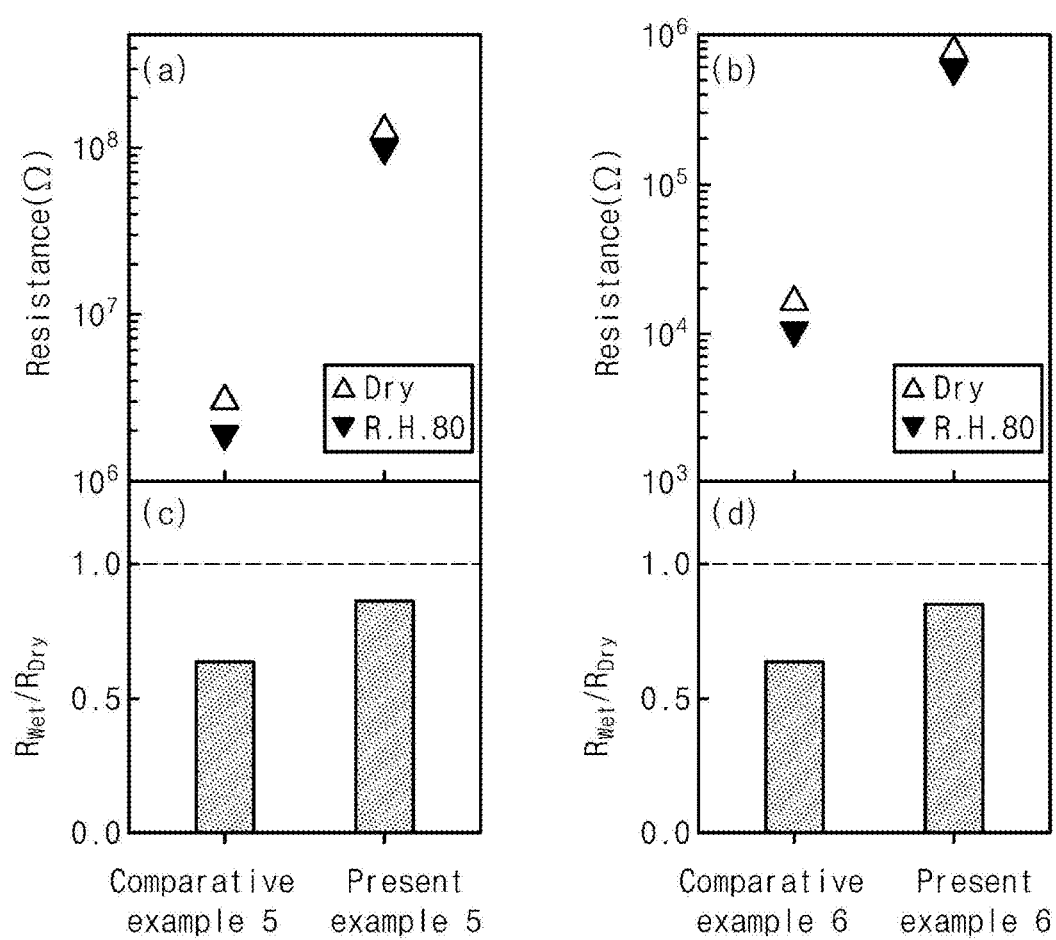
FIG. 13 shows graphs of sensor resistances (FIGS. 13A and 13B) and rates of change in the sensor resistance (FIGS. 13C and 13D) in a dry atmosphere and in an atmosphere of a relative humidity of 80% at a sensing target temperature of 450° C. of Present Example 5, Comparative Example 5, Present Example 6, and Comparative Example 6.

FIG. 13 shows graphs of sensor resistances (FIGS. 13A and 13B) and rates of change in the sensor resistance (FIGS. 13C and 13D) in a dry atmosphere and in an atmosphere of a relative humidity of 80% at a sensing target temperature of 450° C. of Present Example 5, Comparative Example 5, Present Example 6, and Comparative Example 6.

In Comparative Example 5, when exposed to the atmosphere of the 80% relative humidity, the sensor resistance decreased significantly compared to that in the dry atmosphere, so that the rate of change in the sensor resistance was 37.8%, and in Present Example 5, the resistance was not significantly reduced even in the humid atmosphere, thereby exhibiting the rate of change in the sensor resistance of 14.4% (FIGS. 13A and 13C).

In Comparative Example 6, when exposed to the atmosphere of the 80% relative humidity, the sensor resistance decreased significantly compared to that in the dry atmosphere similar to Comparative Example 2, so that the rate of change in the sensor resistance was 36.6%, and in Present Example 6, the resistance was not significantly reduced even in the humid atmosphere, thereby exhibiting the rate of change in the sensor resistance of 16.0% (FIGS. 13B and 13D).

Figure 14:
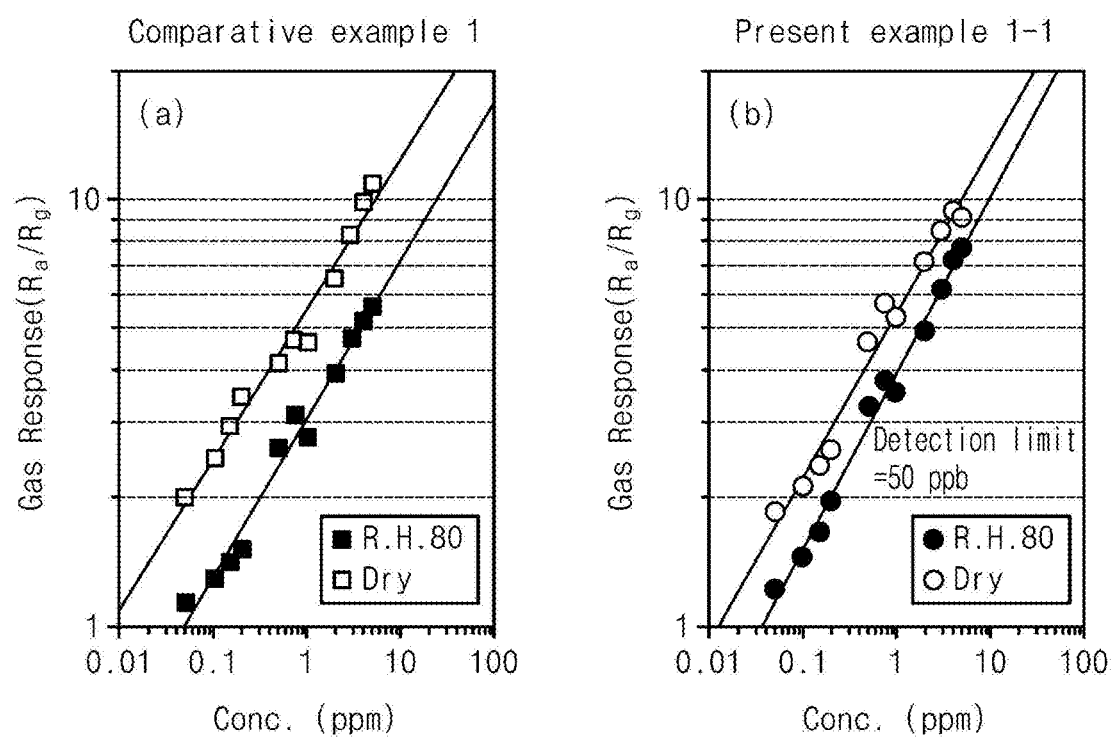
FIG. 14 shows graphs showing gas sensitivities of fine powders based on acetone gas concentration according to Comparative Example 1 (FIG. 14A) and Present Example 1-1 (FIG. 14B).

FIG. 14 shows graphs showing gas sensitivities of fine powders based on acetone gas concentration according to Comparative Example 1 (FIG. 14A) and Present Example 1-1 (FIG. 14B). Compared to Present Example 1-1 (14B), Comparative Example 1 (14A) showed different gas sensitivities based on the concentration of the acetone in the dry atmosphere and in the atmosphere of the 80% relative humidity. The gas sensitivity and the sensor resistance at this time showed characteristics that are hardly affected by the presence or the absence of the moisture. The acetone is a gas that pollutes an environment, and at the same time, is also a biomarker gas of which 300 to 900 ppb is detected in exhalation of normal people and 1800 ppb or more is detected in exhalation of diabetic patients. Therefore, when the acetone of roughly 1 ppm is able to be selectively detected irrespective of the presence or the concentration of the moisture, the acetone may be used for a diabetes self-diagnosis sensor. Because an acetone measurement limit of Present Example 1-1 is at least 50 ppb, it is expected that the gas sensor according to the inventive concept may be sufficiently utilized for a disease diagnosis sensor by exhalation for diabetes self-diagnosis and the like.

Figure 15:
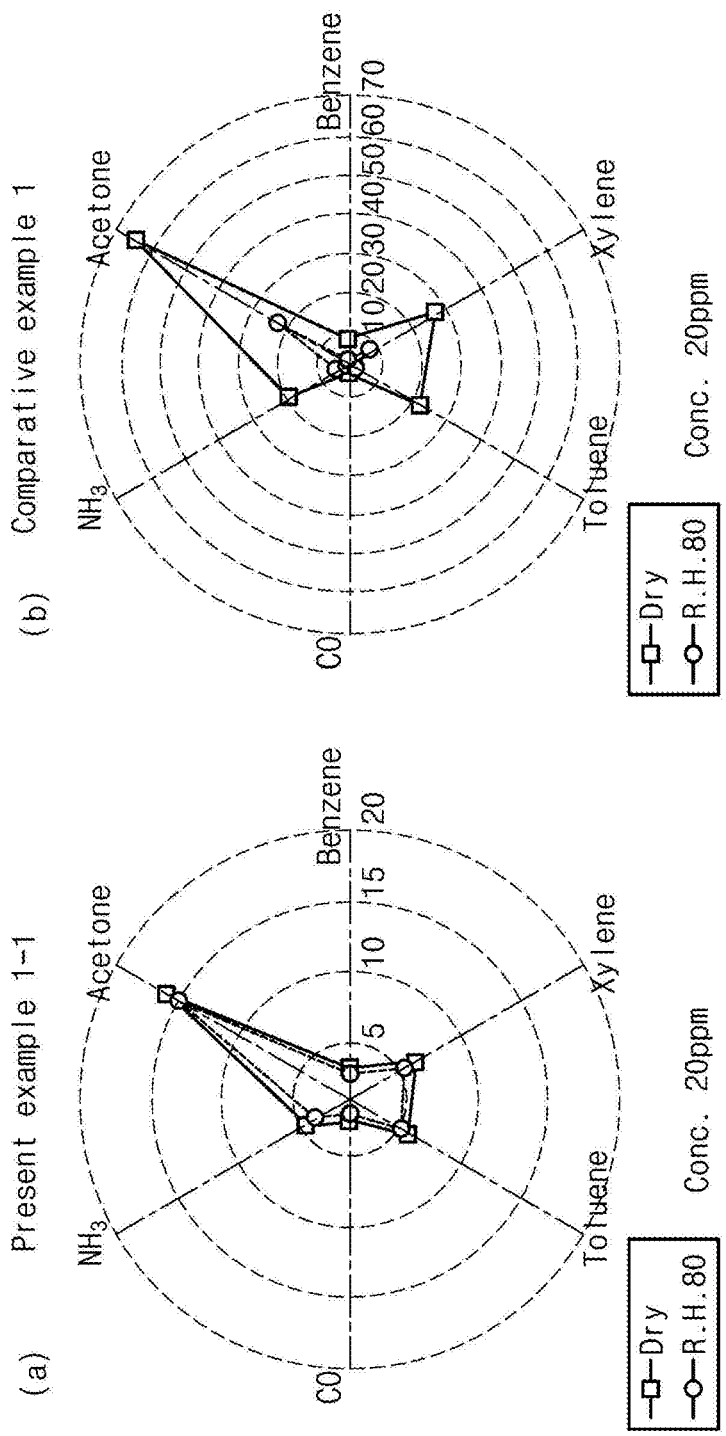
FIG. 15 shows graphs of sensor sensitivities in a dry atmosphere and in an atmosphere of a relative humidity of 80% at 450° C. for 20 ppm of various gases in Present Example 1-1 (FIG. 15A) and Comparative Example 1 (FIG. 15B).

FIG. 15 shows graphs of gas sensitivities at 450° C. for 20 ppm of various gases (acetone, ammonia, carbon monoxide, toluene, xylene, and benzene) in Present Example 1-1 (FIG. 15A) and Comparative Example 1 (FIG. 15B). It may be seen that humidity dependences for various gases in the dry atmosphere and in the atmosphere of the 80% relative humidity are significantly reduced in Present Example 1-1 compared to Comparative Example 1.

The foregoing detailed description illustrates the inventive concept. The foregoing is also illustrative of the preferred embodiments of the inventive concept, and the inventive concept may be used in various other combinations, modifications and environments. That is, the scope and the description of the inventive concept disclosed in this specification may be changed or modified within the scope of equivalents and/or the skill or knowledge of the inventive concept. The embodiments described above are intended to explain certain best modes for implementing the technical idea of the inventive concept. Various modifications required for the specific application and usage of the inventive concept are possible. Therefore, the detailed description of the inventive concept is not intended to limit the inventive concept to the disclosed embodiments. It is also to be understood that the appended claims are intended to cover further embodiments.

The invention claimed is:

1. A method for detecting a gas, the method comprising:
preparing a sensor for detecting the gas by coating a complex on a film,
flowing the gas into the sensor, and
measuring a change in an electrical resistance of the sensor,
wherein the complex comprises a nanostructure made of an oxide semiconductor; and
a Terbium (Tb) additive supported on the nanostructure,
wherein the oxide semiconductor comprises tin oxide ($SnO_2$), and
wherein an atomic percent of the terbium (Tb) additive is more than 5 at % to 20 at % based on a total element amount of tin (Sn) of the nanostructure,
wherein the gas is detected in an atmosphere of a relative humidity of 80% or more, and
wherein the complex is prepared by a method comprising:
preparing a solution comprising tin (Sn) salt, terbium (Tb) salt, and an organic acid or sugar;
performing an ultrasonic spray pyrolysis reaction by spraying the solution through an ultrasonic spray pyrolysis apparatus; and
obtaining the complex as fine powders,
wherein the terbium (Tb) salt is $TbCl_3 \cdot 6H_2O$.

2. The method of claim 1,
wherein the gas is detected in an atmosphere of a relative humidity of about 80%.

3. The method of claim 1, wherein the nanostructure has a hollow structure or an egg yolk structure.

4. The method of claim 1, wherein the gas to be tested is reducing gas selected from the group consisting of acetone, carbon monoxide, ammonia, toluene, xylene, benzene, and mixtures thereof.

5. The method of claim 1, wherein the tin (Sn) salt is selected from the group consisting of $SnC_2O_4$, $SnCl_4 \cdot H_2O$, and mixtures thereof.

6. The method of claim 1, wherein the organic acid is citric acid.

7. The method of claim 1, wherein the sugar is sucrose.

8. The method of claim 1, wherein the ultrasonic spray pyrolysis comprises spraying the solution into an electric furnace heated at a temperature equal to or higher than 700° C. and equal to or lower than 1000° C.

9. The method of claim 1, the ultrasonic spray pyrolysis comprises spraying the solution at a spray speed equal to or higher than 5 L/m and equal to or lower than 20 L/m.

* * * * *